(12) United States Patent
Jung et al.

(10) Patent No.: US 12,341,028 B2
(45) Date of Patent: Jun. 24, 2025

(54) APPARATUS FOR PROCESSING SUBSTRATE

(71) Applicant: SEMES CO., LTD., Chungcheongnam-do (KR)

(72) Inventors: Sun Wook Jung, Chungcheongnam-do (KR); Ha Neul Yoo, Chungcheongnam-do (KR); Woo Ram Lee, Chungcheongnam-do (KR); Young Jun Son, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 168 days.

(21) Appl. No.: 18/367,564

(22) Filed: Sep. 13, 2023

(65) Prior Publication Data

US 2024/0162056 A1 May 16, 2024

(30) Foreign Application Priority Data

Nov. 10, 2022 (KR) .......................... 10-2022-0149152

(51) Int. Cl.
*H01L 21/67* (2006.01)
*B08B 3/02* (2006.01)

(52) U.S. Cl.
CPC ........ *H01L 21/67051* (2013.01); *B08B 3/022* (2013.01)

(58) Field of Classification Search
CPC ................................................ H01L 21/67034
See application file for complete search history.

(56) References Cited

U.S. PATENT DOCUMENTS

2007/0051393 A1   3/2007   Cho et al.

FOREIGN PATENT DOCUMENTS

| KR | 10-2003-0027295 | 4/2003 |
| KR | 10-0654697 | 12/2006 |
| KR | 10-0689664 | 3/2007 |
| KR | 10-1023067 | 3/2011 |

*Primary Examiner* — Jason Y Ko
(74) *Attorney, Agent, or Firm* — WOMBLE BOND DICKINSON (US) LLP

(57) ABSTRACT

An apparatus for processing a substrate includes a first bowl and a processing space therein; a first support portion disposed in the processing space and configured to support the substrate in a first support position; a second bowl disposed to move in a first direction in the processing space; a second support portion configured to move upwardly and downwardly with respect to the first support portion to support the substrate between the second support position disposed above the first support position and the third support position, and to move in the first direction; and a cleaning unit including a first cleaning portion disposed below the substrate toward a rear surface of the substrate in the first support position and a second cleaning portion disposed below the substrate and opposing a rear surface of the substrate between the second support position and the third support position.

20 Claims, 11 Drawing Sheets

APPARATUS FOR PROCESSING SUBSTRATE

CROSS-REFERENCE TO RELATED APPLICATIONS

The application claims benefit of priority to Korean Patent Application No. 10-2022-0149152 filed on Nov. 10, 2022 in the Korean Intellectual Property Office, the disclosure of which is incorporated herein by reference in its entirety.

BACKGROUND

1. Field

Embodiments of the present disclosure relate to an apparatus for processing a substrate.

Generally, in this process of manufacturing a semiconductor, a cleaning device may be used to clean a substrate according to the process needs. Also, to clean the rear surface of a substrate, a method of cleaning the rear surface of the substrate while the substrate is reversed may be applied to the cleaning device. Since this cleaning device includes a reversing device for reversing the substrate, a space for installing the reversing device may be required, and also, it may be difficult to realize compactness of the device, and costs and maintenance costs of the device may increase. Continuous research has been conducted on an apparatus for processing a substrate which may improve efficiency of cleaning a substrate.

2. Description of Related Art

An embodiment of the present disclosure is to provide an apparatus for processing a substrate which may improve efficiency of cleaning a substrate.

SUMMARY

According to an embodiment of the present disclosure, an apparatus for processing a substrate includes a first bowl having a first opening having an upper portion and a processing space therein; a first support portion disposed in the processing space and configured to support the substrate in a first support position to allow the substrate to rotate; a second bowl having a second opening surrounding the substrate, disposed to move in a first direction in the processing space of the first bowl, and surrounding the first support portion; a second support portion configured to move upwardly and downwardly with respect to the first support portion to support the substrate between the second support position disposed above the first support position and the third support position, which is a position spaced apart the first direction from the second support position, and to move in the first direction; and a cleaning unit including a first cleaning portion disposed below the substrate toward a rear surface of the substrate in the first support position and a second cleaning portion disposed below the substrate and opposing a rear surface of the substrate between the second support position and the third support position, wherein a shortest distance between an upper surface of the substrate in the first support position and the second bowl is smaller than a shortest distance between the second bowl and an upper surface of the substrate in the second support position or the third support position.

The second bowl may include an upper wall in which the second opening is formed and a side wall extending downwardly from a circumferential surface of the upper wall, and the upper wall may include a first surface connecting the second opening to an internal wall surface of the side wall, and a support surface of the second support portion has a predetermined level difference from the first surface of the second bowl such that the upper surface of the substrate in the second support position or the third support position may be disposed on a level lower than a level of the first surface of the second bowl.

The first surface may include a first rounded surface connected to the second opening in a rounded manner, and a shortest distance between the second bowl and the upper surface of the substrate and in the first support position, the second support position or the third support position may be defined between the substrate and the first rounded surface.

The first surface may include a horizontal surface connected to the first rounded surface, and an upper surface of the substrate in the first support position may be disposed on the same plane as the horizontal surface.

The second bowl may be formed by a vertical wall surface in which an internal wall surface forming the second opening extends vertically.

The shortest distance between an upper surface of the substrate in the first support position and the second bowl may be 3 to 4 mm, and the level difference may be 3 to 4 mm.

The first cleaning portion may include a first cleaning nozzle configured to clean an edge region of the substrate, and the second cleaning portion may include a second cleaning nozzle configured to clean a central region of the substrate, and the first cleaning nozzle and the second cleaning nozzle may be disposed at different azimuth angles around the first support portion.

The first cleaning portion may include a plurality of first cleaning nozzles disposed symmetrically with respect to a center of the first support portion.

The second cleaning nozzle may include a plurality of second cleaning holes disposed in a second direction perpendicular to the first direction.

At least one of the first cleaning nozzle and the second cleaning nozzle may be disposed to moveable.

The apparatus may further include a guide portion disposed in the first bowl, disposed to surround the first cleaning portion and the second cleaning portion, and configured to guide a flow of fluid in the processing space.

The guide portion may extend in a vertical direction between an external side of the first cleaning portion and the second cleaning portion and an inner side of an edge of the substrate in the first support position.

The guide portion may include a guide body surrounding at least a portion of the first cleaning portion and the second cleaning portion and an avoidance portion configured to avoid movement of the second bowl in the first direction.

The avoidance portion may include an avoidance port in which a portion of the guide body is opened or an avoidance wall in which a portion of the guide body extends in a linear line in a second direction perpendicular to the first direction.

The second support portion may include an adsorption chuck coupled to the second bowl.

The apparatus may further include a second bowl driving portion connected to the second bowl from an external side of the first bowl and configured to drive the second bowl to move in the first direction in the processing space and to move up and down in the vertical direction, and the second support portion may be coupled to the second bowl and may be configured to move and move up and down integrally with the second bowl.

The first bowl may include a base having an upper portion and an upper cover having the first opening, covering an upper portion of the base, and forming the processing space together with the base, and the first opening may be formed to be larger than the second opening to expose the second opening in the first support position, the second support position and the third support position.

According to an embodiment of the present disclosure, a first bowl having a first opening having an upper portion and a processing space therein; a first support portion disposed in the processing space and configured to support the substrate in a first support position to allow the substrate to rotate; a second bowl having a second opening surrounding the substrate, disposed to move in a first direction in the processing space of the first bowl, and surrounding the first support portion; a second support portion coupled to the second bowl to move integrally with the second bowl and to move up and down integrally with the second bowl, and configured to move the substrate upwardly and downwardly with respect to the first support portion between the second support position above the first support position and the third support position, which is a position spaced apart the first direction from the second support position, and configured to move in the first direction; a cleaning unit including a first cleaning portion including a first cleaning nozzle disposed below the substrate toward a rear surface of the substrate in the first support position, and a second cleaning portion disposed below the substrate and including a second cleaning nozzle disposed toward the rear surface of the substrate between the second support position and the third support position; and a guide portion disposed in the first bowl, and disposed to surround the first cleaning nozzle and the second cleaning nozzle and extending in a vertical direction between an external side of the first cleaning nozzle and the second cleaning nozzle and an inner side of an edge of the substrate in the first support position, the second bowl includes an upper wall in which the second opening is formed and a side wall extending downwardly from a circumferential surface of the upper wall, and the upper wall includes a first surface connecting the second opening to an internal wall surface of the side wall, and a shortest distance between the first surface and an upper surface of the substrate in the first support position is smaller than a shortest distance between the first surface and the upper surface of the substrate in the second support position or the third support position.

The support surface of the second support portion may have a predetermined level difference from the first surface of the second bowl such that the upper surface of the substrate in the second support position or the third support position may be disposed on a level lower than a level of the first surface of the second bowl, and the second bowl may be formed by a vertical wall surface in which an internal wall surface forming the second opening extends vertically.

The apparatus may further include a process chamber; a gas flow generator disposed in the process chamber and configured to generate a flow of gas by supplying gas into the process chamber; a first bowl disposed in the process chamber, having a first opening having an upper portion, a discharge portion having a processing space therein and configured to discharge liquid to a lower portion, and an exhaust portion configured to discharge gas; a first support portion disposed in the processing space and supporting the substrate in a first support position to allow the substrate to rotate; a second bowl having a second opening surrounding the substrate, formed by a vertical wall surface in which an internal wall surface forming the second opening extends vertically, move upwardly and downwardly in a processing space of the first bowl, and surrounding the first support portion disposed to move in a first direction; a second bowl driving portion connected to the second bowl from the external side of the first bowl, and configured to drive the second bowl to move in the first direction and to move upwardly and downwardly in the processing space; a second support portion coupled to the second bowl to move integrally with the second bowl and to move up and down integrally with the second bowl, configured to move the substrate upwardly and downwardly with respect to the first support portion between a second support position above the first support position and a third support position that, which is a position spaced apart the first direction from the second support position, and configured to move in the first direction; a cleaning unit including a first cleaning portion including a plurality of first cleaning nozzles disposed below the substrate toward a rear surface of the substrate in the first support position, and a second cleaning portion including a second cleaning nozzle disposed below the substrate and disposed toward the rear surface of the substrate between the second support position and the third support position; and a guide portion disposed in the first bowl, disposed to surround the plurality of first cleaning nozzles and the second cleaning nozzle, and extending in a vertical direction between external sides of the plurality of first cleaning nozzles and the second cleaning nozzle and an inner side of an edge of the substrate in the first support position, wherein the second bowl includes an upper wall in which the second opening is formed and a side wall extending downwardly around the upper wall, the upper wall includes a vertical wall surface forming the second opening and a first surface connecting the vertical wall surface to an internal wall surface of the side wall, and the first surface includes a first rounded surface connected to the vertical wall surface in a rounded manner, a horizontal surface connected to the first rounded surface and a second rounded surface connecting the horizontal surface to the internal wall surface of the side wall, wherein a shortest distance between an upper surface of the substrate in the first support position and the first rounded surface is smaller than a shortest distance between an upper surface of the substrate in the second support position or the third support position and the first rounded surface, and wherein a support surface of the second support portion has a predetermined level difference from the horizontal surface such that an upper surface of the substrate in the second support position or the third support position is disposed on a level lower than a level of the horizontal surface.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
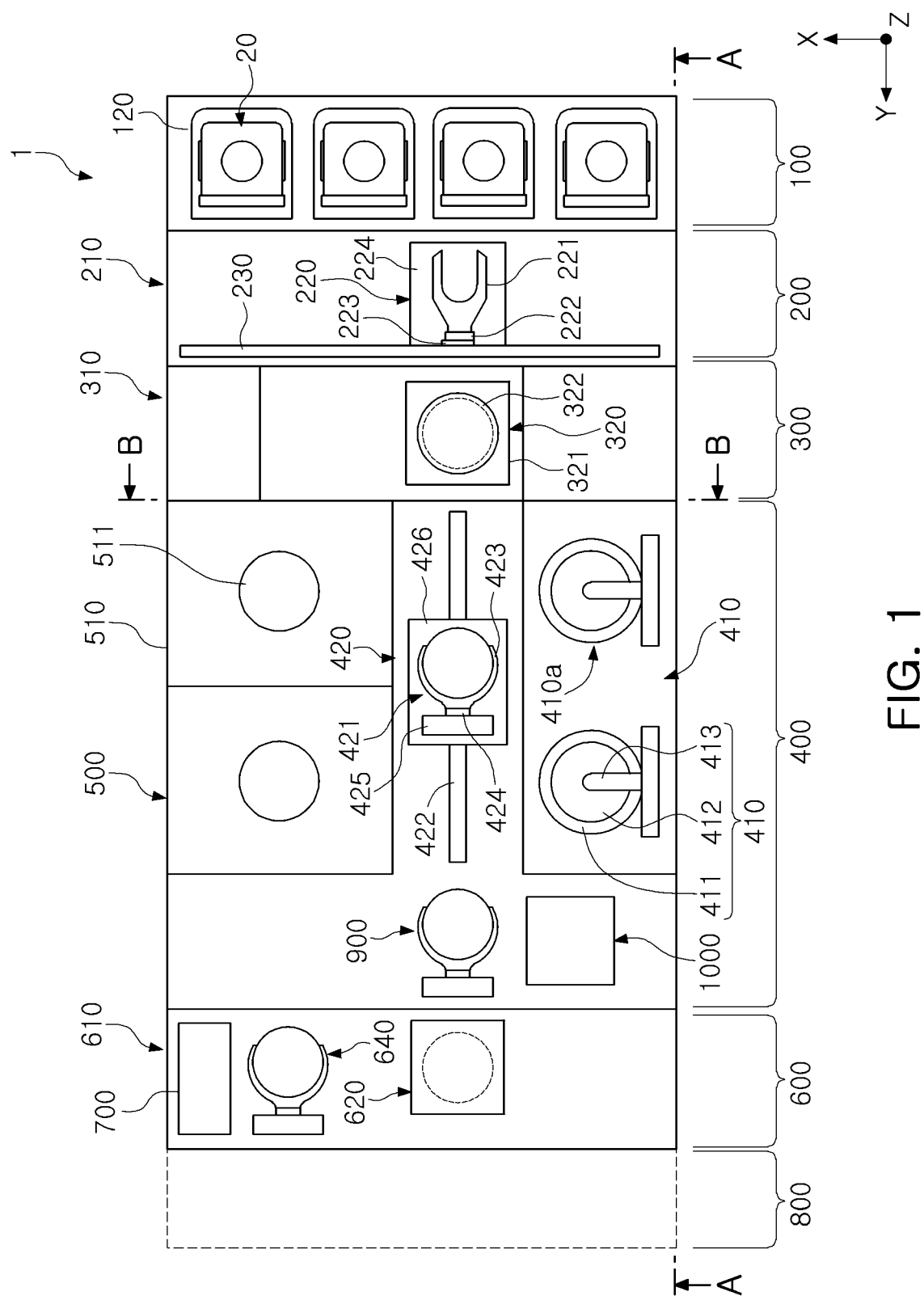
FIG. 1 is a diagram illustrating an apparatus for processing a substrate according to an embodiment of the present disclosure, viewed from above.

Hereinafter, embodiments of the present disclosure will be described as below with reference to the attached drawings. The present disclosure may be implemented in different forms and are not limited to the embodiments described herein.

In the drawings, same elements will be indicated by same reference numerals. Also, redundant descriptions and detailed descriptions of known functions and elements that may unnecessarily make the gist of the present disclosure obscure will not be provided. In the drawings, same elements will be indicated by same reference numerals. The terms such as "upper," "upper portion," "upper side," "upper surface," "upper wall surface," "lower" "lower portion," "lower side," "lower surface," "lower wall surface" refer to the drawings. Also, the terms such as "internal" and "external" are based on a peripheral portion of the component, and may vary depending on the direction in which the element or component may be disposed.

In the embodiment, the term "connected" may not only refer to "directly connected" but also include "indirectly connected" by means of an adhesive layer, or the like. Also, the term "electrically connected" may include both of the case in which elements are "physically connected" and the case in which elements are "not physically connected. The terms, "include," "comprise," "is configured to," or the like of the description are used to indicate the presence of features, numbers, operations, operations, elements, portions or combination thereof, and do not exclude the possibilities of combination or addition of one or more features, numbers, operations, operations, elements, portions or combination thereof.

Figure 2:
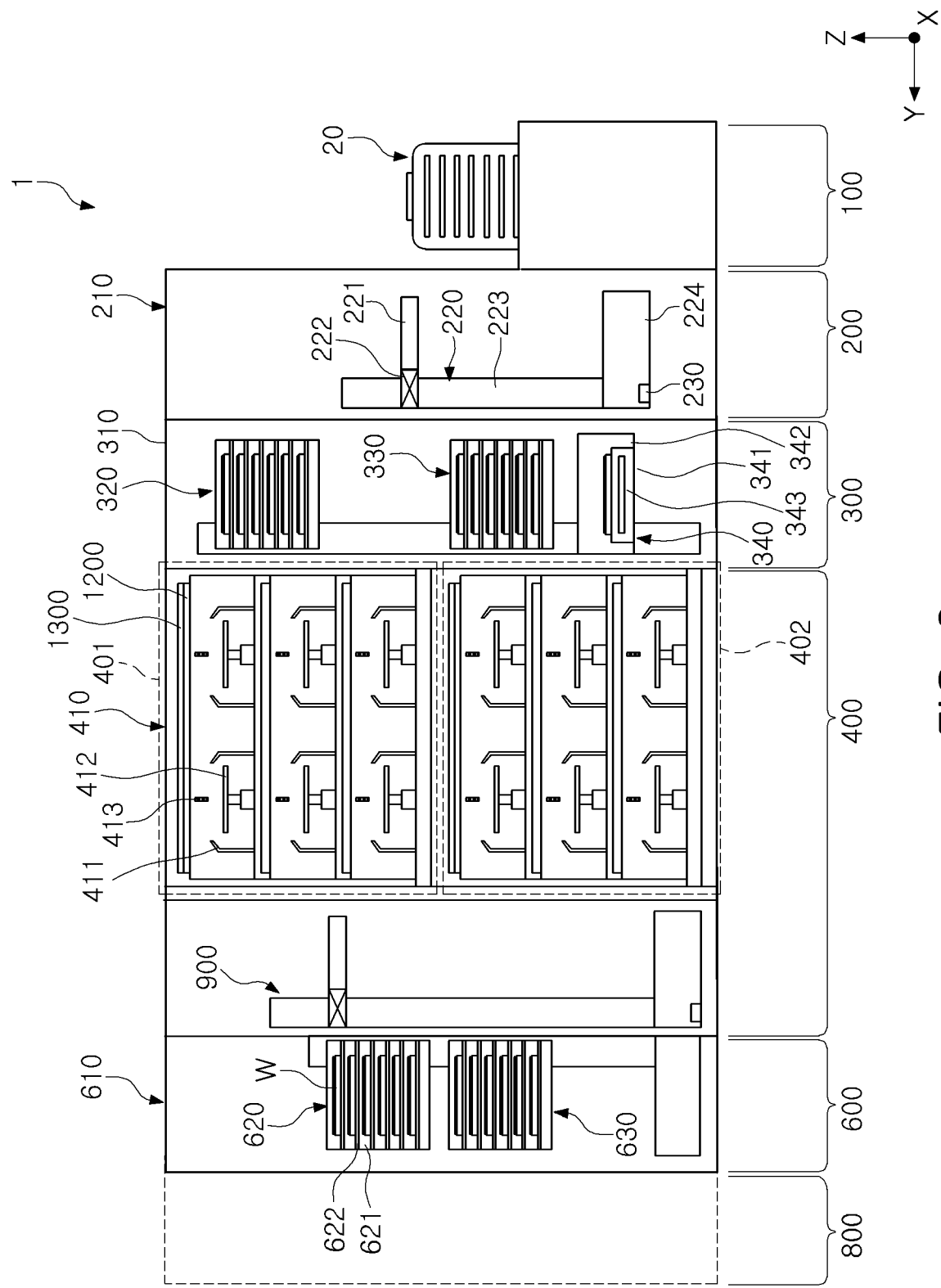
FIG. 2 is a diagram illustrating the apparatus for processing a substrate illustrated in FIG. 1, viewed in a A-A direction.
Figure 3:
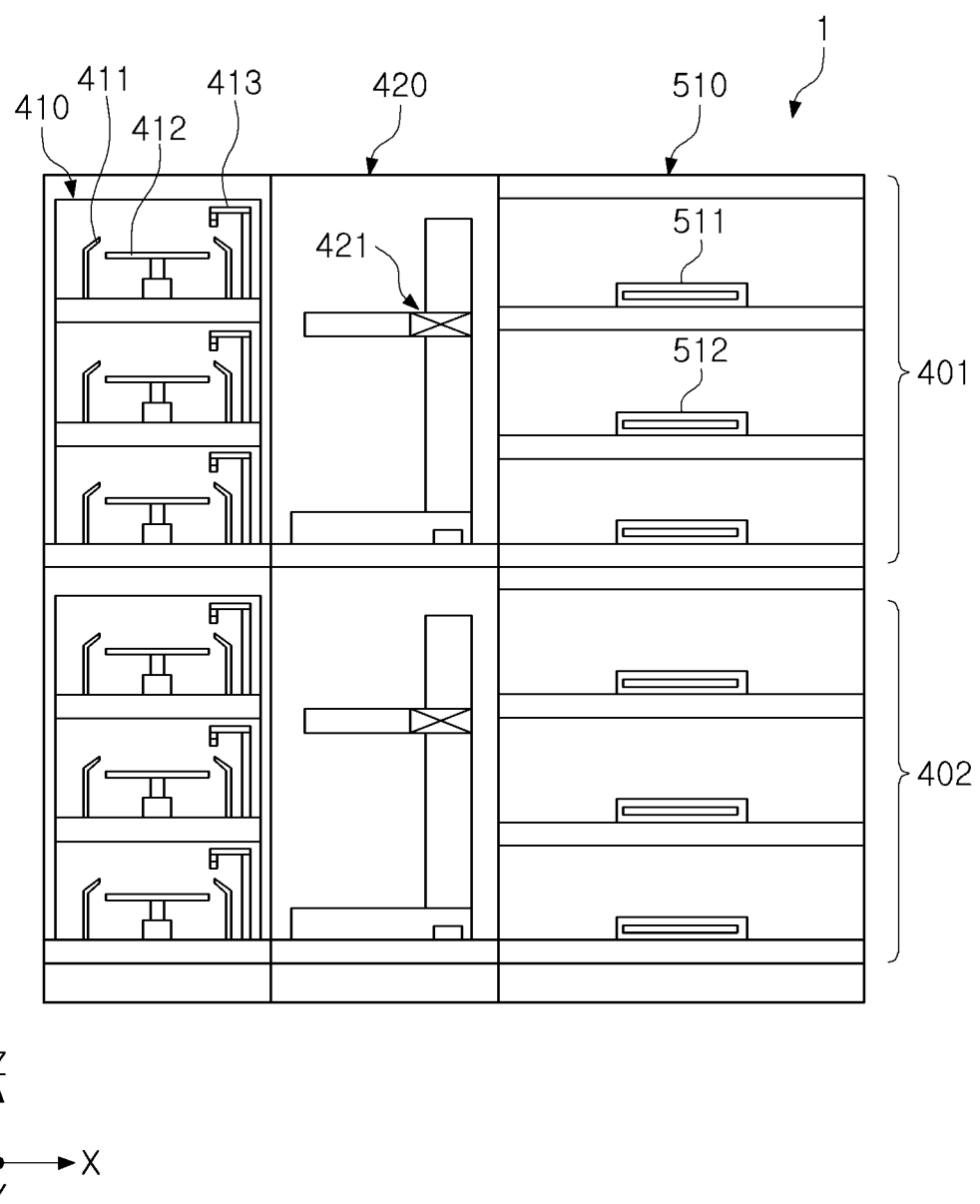
FIG. 3 is a diagram illustrating the apparatus for processing a substrate illustrated in FIG. 1, viewed in a B-B direction.

FIG. 1 is a diagram illustrating an apparatus for processing a substrate according to an embodiment, viewed from above. FIG. 2 is a diagram illustrating the apparatus for processing a substrate illustrated in FIG. 1, viewed in a A-A direction. FIG. 3 is a diagram illustrating the apparatus for processing a substrate illustrated in FIG. 1, viewed in a B-B direction.

Referring to FIGS. 1 to 3, the apparatus 1 for processing a substrate may include a load port 100, an index module 200, a buffer module 300, an applying and developing module 400, and a purge module 700. The load port 100, the index module 200, the buffer module 300, the applying and developing module 400 and the interface module 600 may be disposed in order in a row in one direction. The purge module 700 may be provided in the interface module 600. Alternatively, the purge module 700 may be provided in various positions, such as a position to which an exposure device of the rear end of the interface module 600 is connected or a side portion of the interface module 600.

Hereinafter, the direction in which the load port 100, the index module 200, the buffer module 300, the applying and developing module 400, and the interface module 600 are disposed may be referred to as the first direction Y, and the direction perpendicular to the first direction Y when viewed from the top may be referred to as the second direction X, and the direction perpendicular to the first direction Y and the second direction X may be referred to as the third direction Z.

The substrate W may move while being stored in the cassette 20. The cassette 20 may have a sealed structure. For example, a front open unified pod (FOUP) having a door on the front side may be used as the cassette 20.

Hereinafter, the load port 100, the index module 200, the buffer module 300, the applying and developing module 400, the interface module 600, and the purge module 700 will be described in greater detail.

The load port 100 may have a mounting table 120 on which the cassette 20 including the substrate W is disposed. A plurality of the mounting tables 120 may be provided, and the mounting tables 120 may be disposed in a row in the second direction X. FIG. 2 illustrates the example in which four mounting tables 120 may be provided, and the number of the mounting tables 120 may be varied.

The index module 200 may transfer the substrate W between the cassette 20 and the buffer module 300 disposed on the mounting table 120 of the load port 100. The index module 200 may include a frame 210, an index robot 220, and a guide rail 230. The frame 210 may be generally provided in the shape of a rectangular parallelepiped having a void therein, and may be disposed between the load port 100 and the buffer module 300. The frame 210 of the index module 200 may be provided the frame 310 of the buffer module 300. The index robot 220 and the guide rail 230 may be disposed in the frame 210. The index robot 220 may be provided such that the hand 221 for directly handling the substrate W may move and rotate in the first direction Y, the second direction X, and the third direction Z. The index robot 220 may include the hand 221, an arm 222, a support stand 223, and a support table 224. The hand 221 may be fixed to and installed in the arm 222. The arm 222 may be provided with a stretchable structure and a rotatable structure. The support stand 223 may be disposed such that a length direction thereof may be disposed in the third direction Z. The arm 222 may be coupled to the support stand 223 so as to move along the support stand 223. The support stand 223 may be fixed and coupled to the support table 224. The guide rail 230 may be provided such that a length direction thereof may be disposed in the second direction X. The support table 224 may be coupled to the guide rail 230 so as to be linearly movable along the guide rail 230. Also, although not illustrated, a door opener for opening and closing the door of the cassette 20 may be further provided in the frame 210.

The buffer module 300 may include a frame 310, a first buffer 320, a second buffer 330 and a cooling chamber 340. The frame 310 may be provided in the shape of a cuboid having a void therein, and may be disposed between the index module 200 and the applying and developing module 400. The first buffer 320, the second buffer 330 and the cooling chamber 340 may be disposed in the frame 310. The cooling chamber 340, the second buffer 330, and the first buffer 320 may be disposed in order in the third direction Z upwardly. The first buffer 320 may be disposed on a level corresponding to the applying module 401 of the applying and developing module 400, and the second buffer 330 and the cooling chamber 340 may be provided on a level corresponding to the developing module 402 of the applying and developing module 400.

Each of the first buffer 320 and the second buffer 330 may temporarily store a plurality of substrates W. The first buffer 320 may have a housing 321 and a plurality of support stands 322. In the first buffer 320, the support stands 322 may be disposed in the housing 321 and may be spaced apart from each other in the third direction Z. The second buffer 330 may have a housing 331 and a plurality of support stands 332. In the second buffer 330, the support stands 332 may be disposed in the housing 331 and may be spaced apart from each other in the third direction Z. A single substrate W may be disposed on each support stand 322 of the first buffer 320 and each support stand 332 of the second buffer 330. The housing 331 may have an opening in the direction in which the index robot 220 is provided such that the index robot 220 may insert the substrate W into or take the substrate W out of the support stand 332 in the housing 331. The first buffer 320 may have a structure substantially similar to that of the second buffer 330. However, the housing 321 of the first buffer 320 may have an opening in the direction in which the first buffer robot 360 is provided and in the direction in which the applying portion robot 421 disposed on the applying module 401 is provided. The number of support stands 322 provided in the first buffer 320 and the number of support stands 332 provided in the second buffer 330 may be the same or different. In an example, the number of support stands 332 provided in the second buffer 330 may be greater than the number of support stands 322 provided in the first buffer 320.

The cooling chambers 340 may cool the substrates W, respectively. The cooling chamber 340 may include a housing 341 and a cooling plate 342. The cooling plate 342 may have an upper surface on which the substrate W is disposed and a cooling means 343 for cooling the substrate W. As the cooling means 343, various methods such as cooling by cooling water or cooling using a thermoelectric element may be used. Also, a lift pin assembly for disposing the substrate W on the cooling plate 342 may be provided in the cooling chamber 340. The housing 341 may have openings in the direction in which the index robot 220 is provided and the direction in which the developing robot is provided such that the developing robot provided in the index robot 220 and the developing module 402 may insert the substrate W into or take the substrate W out of the cooling plate 342. Also, doors for opening and closing the aforementioned opening may be provided in the cooling chamber 340.

The applying module 401 may include a process of applying a photoresist such as photoresist to the substrate W and a heat treatment process such as heating and cooling to the substrate W before and after the resist application process. The applying module 401 may have an applying chamber 410, a heat treatment chamber portion 500, and a transfer chamber 420. The applying chamber 410, the transfer chamber 420, and the heat treatment chamber portion 500 may be disposed in order in the second direction X. That is, based on the transfer chamber 420, the application chamber 410 may be provided on one side of the transfer chamber 420, and the heat treatment chamber portion 500 may be provided on the other side of the transfer chamber 420.

A plurality of the applying chambers 410 may be provided, and the plurality of the applying chambers 410 may be provided in the third direction Z. Also, as illustrated in FIG. 1, the plurality of applying chambers 410 may be provided in the first direction Y, or a single applying chamber may be provided in the first direction Y. The heat treatment chamber portion 500 may include a bake chamber 510 and a cooling chamber 520, and a plurality of the bake chambers 510 and a plurality of the cooling chamber 520 may be provided in the third direction Z. The transfer chamber 420 may be disposed side by side in the first direction 12 with the first buffer 320 of the first buffer module 300. An applying portion robot 421 and a guide rail 422 may be disposed in the transfer chamber 420. The transfer chamber 420 may have a substantially rectangular shape. The applying portion robot 421 may transfer the substrate W between the bake chamber 510, the cooling chamber 520, the applying chamber 410, and the first buffer 320 of the first buffer module 300.

The guide rail 422 may be disposed such that a length direction thereof may be parallel to the first direction Y. The guide rail 422 may guide the applying portion robot 421 to move linearly in the first direction Y. The applying portion robot 421 may have a hand 423, an arm 424, a support stand 425, and a support table 426. The hand 423 may be fixed to and installed in the arm 424. The arm 424 may be provided to have a flexible structure such that the hand 423 may move in the horizontal direction. The support stand 425 may be provided such that a length direction thereof may be disposed in the third direction Z. The arm 424 may be coupled to the support stand 425 to move linearly in the third direction Z along the support stand 425. The support stand 425 may be fixed and coupled to the support table 426, and the support table 426 may be coupled to the guide rail 422 so as to move along the guide rail 422.

The entirety of the applying chambers 410 may have the same structure, but the types of treatment liquids used in each of the applying chambers 410 may be different. As the treatment liquid, a treatment liquid for forming a photoresist film or an anti-reflection film may be used.

The applying chamber 410 may apply a treatment liquid to the substrate W. A processing unit including a processing vessel 411, a support portion 412 and a nozzle portion 413 may be provided in the applying chamber 410.

For example, in each applying chamber 410, a single processing unit may be disposed in the first direction Y, but an embodiment thereof is not limited thereto, and two or more processing units may be disposed in each applying chamber 410. Each processing unit may have the same structure. However, the types of processing liquids used in each processing unit may be different.

The processing vessel 411 of the applying chamber 410 may have an upper portion shape. The support portion 412 may be disposed in the processing vessel 411 and may support the substrate W. The support portion 412 may be configured to rotate. The nozzle portion 413 may supply the treatment liquid to the substrate W disposed on the support portion 412. The treatment liquid may be applied to the substrate W by a spin coat method. Also, in the applying chamber 410, a nozzle for supplying a cleaning liquid such as deionized water (DIW) to clean the surface of the substrate W to which the treatment liquid is applied (not illustrated) and a back rinse nozzle (not illustrated) for cleaning a lower surface of the substrate W may optionally be further provided.

In the bake chamber 510, when the substrate W is seated by the applying portion robot 421, the substrate W may be heat-treated.

In the bake chamber 510, before applying the treatment liquid to remove organic matter or moisture from the surface of the substrate W, a prebake process of heating the substrate W to a predetermined temperature or a soft bake process performed after the treatment liquid is applied on the wafer W may be performed, and after each heating process, a cooling process for cooling the substrate W may be performed.

The bake chamber 510 may include a heating plate 511 and a cooling plate 512. The cooling plate 512 may be provided with a cooling means such as cooling water or a thermoelectric element.

In the cooling chamber 520, a cooling process of cooling the substrate W may be performed before applying a treatment liquid. A cooling plate may be provided in the cooling chamber 5420. The cooling plate may include a cooling means in which various methods such as cooling by cooling water or cooling using a thermoelectric element may be used to cool the substrate W.

The interface module 600 may connect the applying and developing module 400 to the exposure device 800. The interface module 600 may include an interface frame 610, a first interface buffer 620, a second interface buffer 630 and a transfer robot 640, and the transfer robot 640 may transfer the substrate returned to the first and second interface buffers 620 and 630 after the applying and developing module 400 is finished to the exposure device 800. The first and second interface buffer 620 may include a housing 621 and a support stand 622, and a transfer robot 640 and an applying portion robot 421 may insert the substrate W into or may take the substrate W out of the support stand 622.

Here, before transferring the substrate W from the applying and developing module 400 to the exposure device 800, the rear surface of the substrate W may be cleaned. The apparatus 1000 for processing a substrate for cleaning the rear surface of the substrate W may be disposed at the entrance of the interface module 600. As a specific example, as illustrated in FIG. 1, the apparatus may be disposed in a position adjacent to the interface module 600 in the applying and developing module 400, but an embodiment thereof is not limited thereto, and the apparatus may be disposed in the interface module 600. Alternatively, a chamber for disposing the apparatus 1000 for processing a substrate cleaning the rear surface of the substrate W may be disposed between the applying and developing module 400 and the interface module 600. Also, a robot 900 for transferring the substrate W may be disposed between the applying and developing module 400, the interface module 600 and the apparatus 1000 for processing a substrate.

Generally, a method of cleaning the rear surface of a substrate in a state in which the substrate is inverted may be applied to an apparatus for processing a substrate for cleaning the rear surface of a substrate. Since the apparatus for processing a substrate includes a reversing device for reversing the substrate, a space may be necessary to install the reversing device, and also, it may be difficult to implement compactness of the device, and costs and maintenance costs of the device may increase. Also, to clean the rear surface of the substrate, a cleaning device for directly cleaning the rear surface of the substrate without a reversing device may be provided, but when the rear surface of the substrate is cleaned, due to the flow of gas inside the process chamber, vortex of fluid including gas and cleaning liquid in the cleaning device may occur, and accordingly, re-dispersion of fine droplets onto the substrate may occur, such that the cleaning efficiency of the rear surface of the substrate may degrade.

To address the issues detailed above, the configuration of an apparatus for processing a substrate will be described according to various embodiments.

Figure 4:
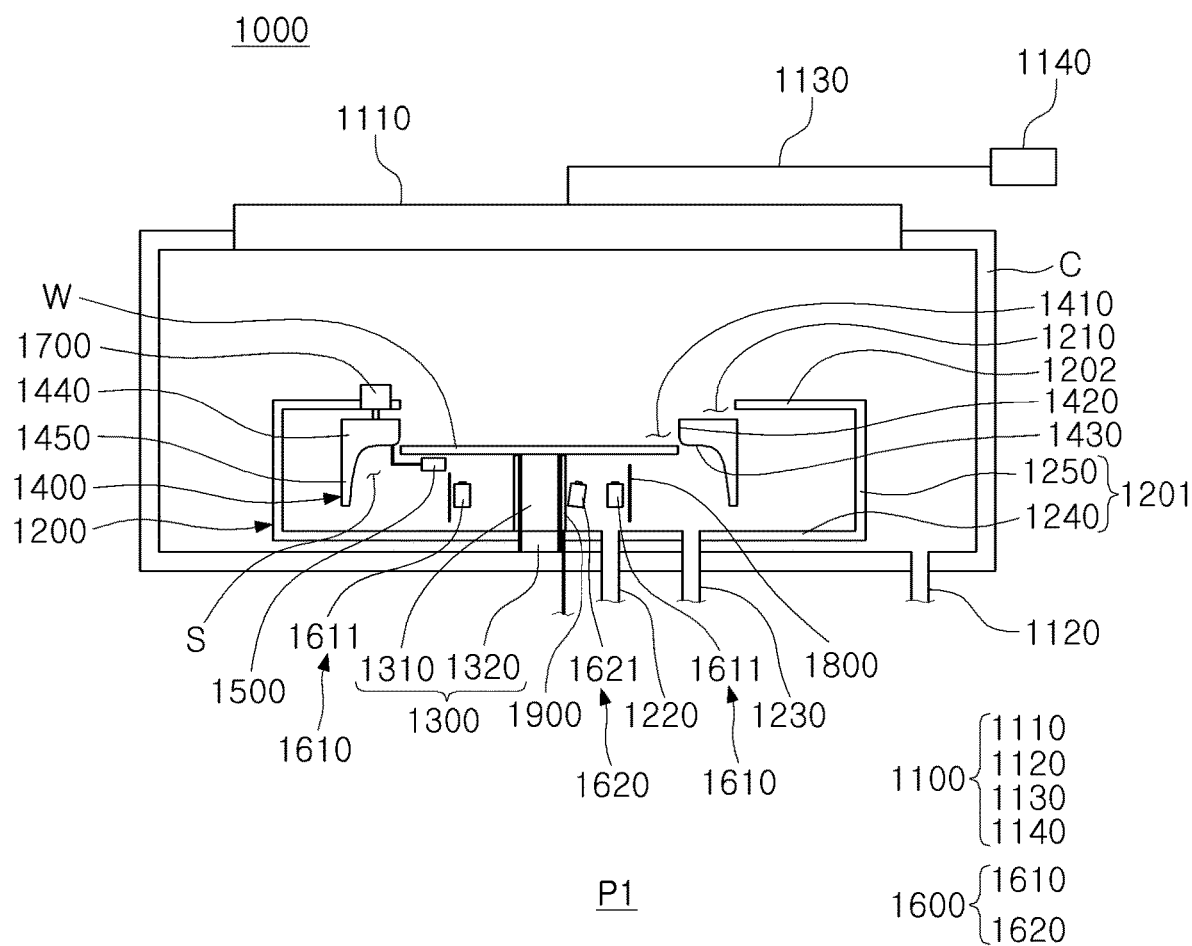
FIG. 4 is a diagram illustrating a state in which a substrate is supported by a first support portion in an apparatus for processing a substrate for cleaning a rear surface of a substrate according to an embodiment of the present disclosure.
Figure 5:
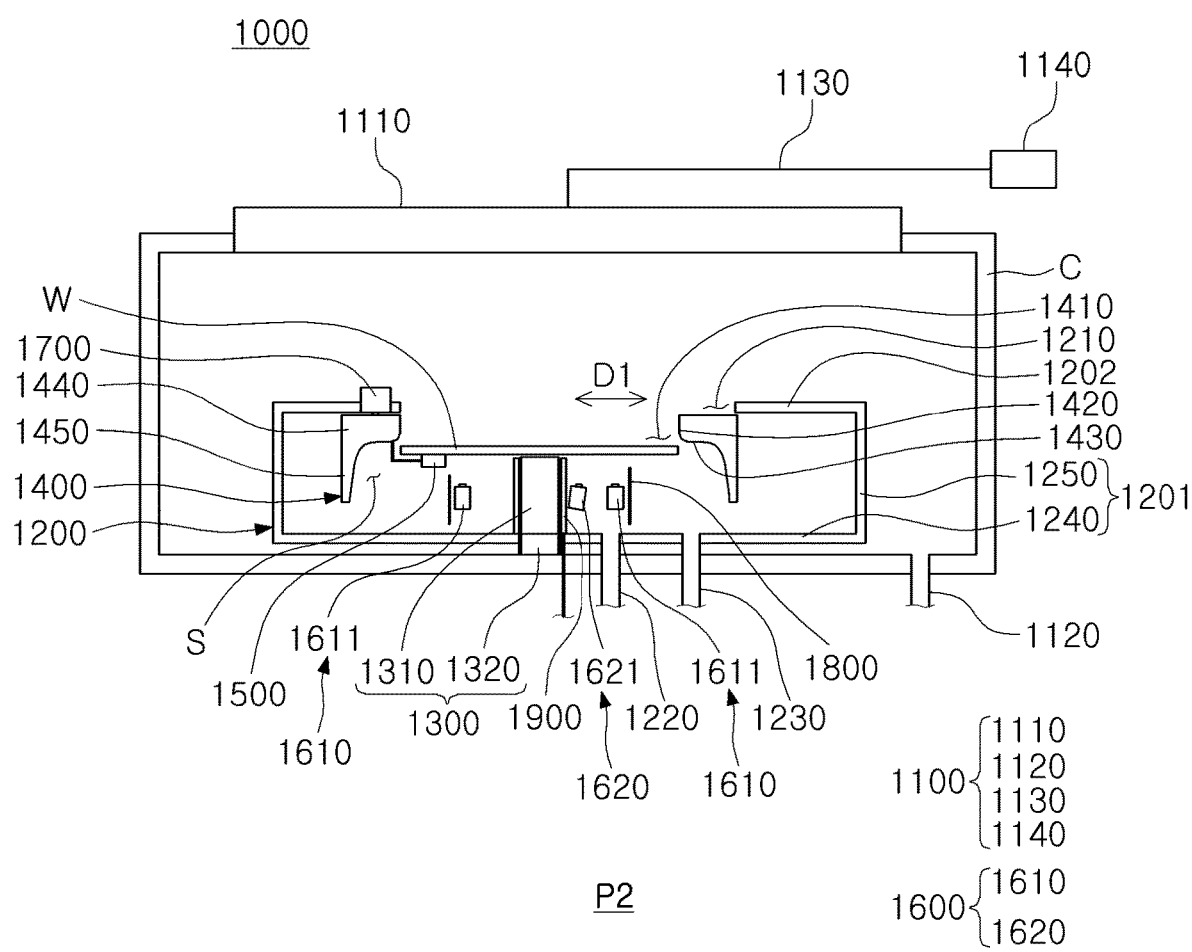
FIG. 5 is a diagram illustrating a state in which a substrate is supported by a second support portion in an apparatus for processing a substrate for cleaning a rear surface of a substrate according to an embodiment of the present disclosure.
Figure 6:
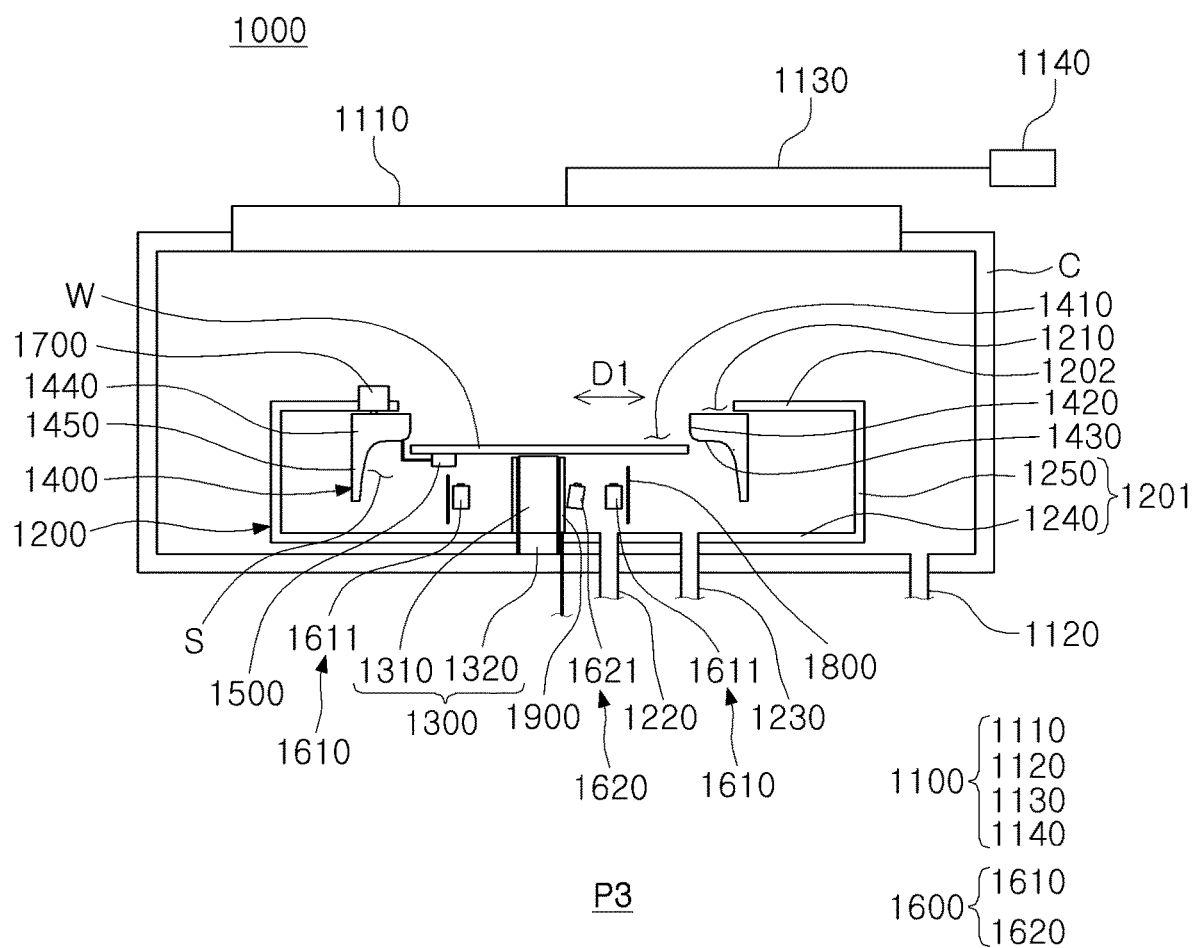
FIG. 6 is a diagram illustrating a state of moving in a first direction in FIG. 5.
Figure 7:
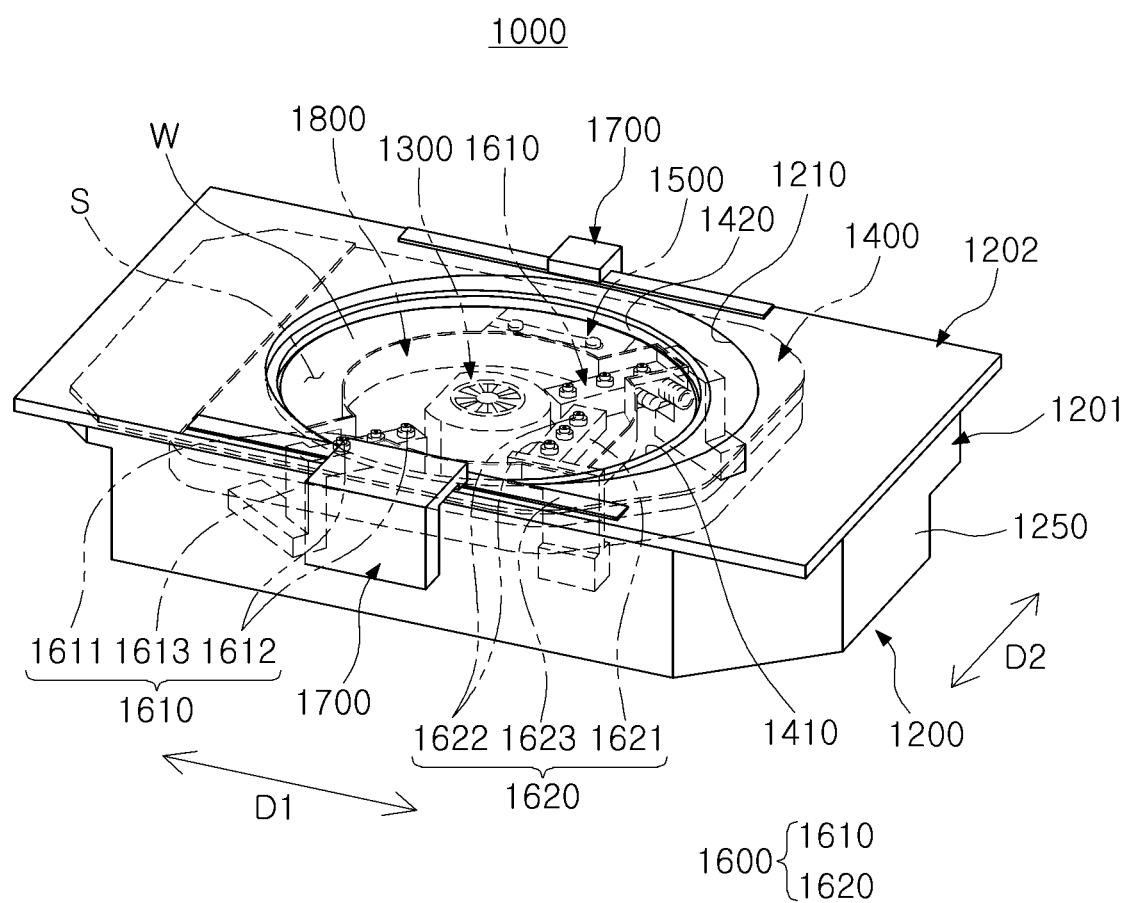
FIG. 7 is a perspective diagram illustrating an apparatus for processing a substrate according to an embodiment of the present disclosure.
Figure 8:
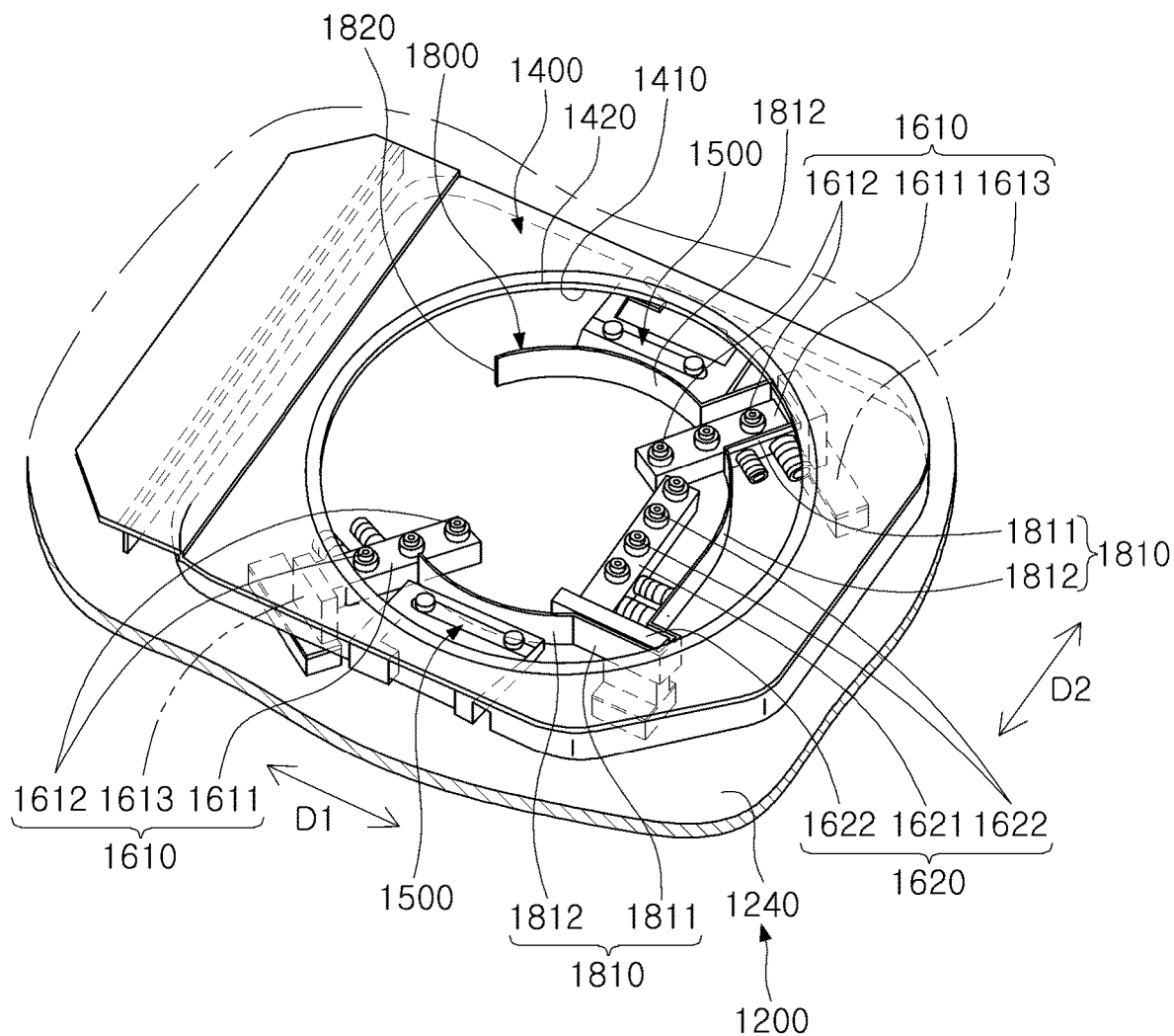
FIG. 8 is a diagram illustrating a portion of components of an apparatus for processing a substrate according to an embodiment of the present disclosure.
Figure 9:
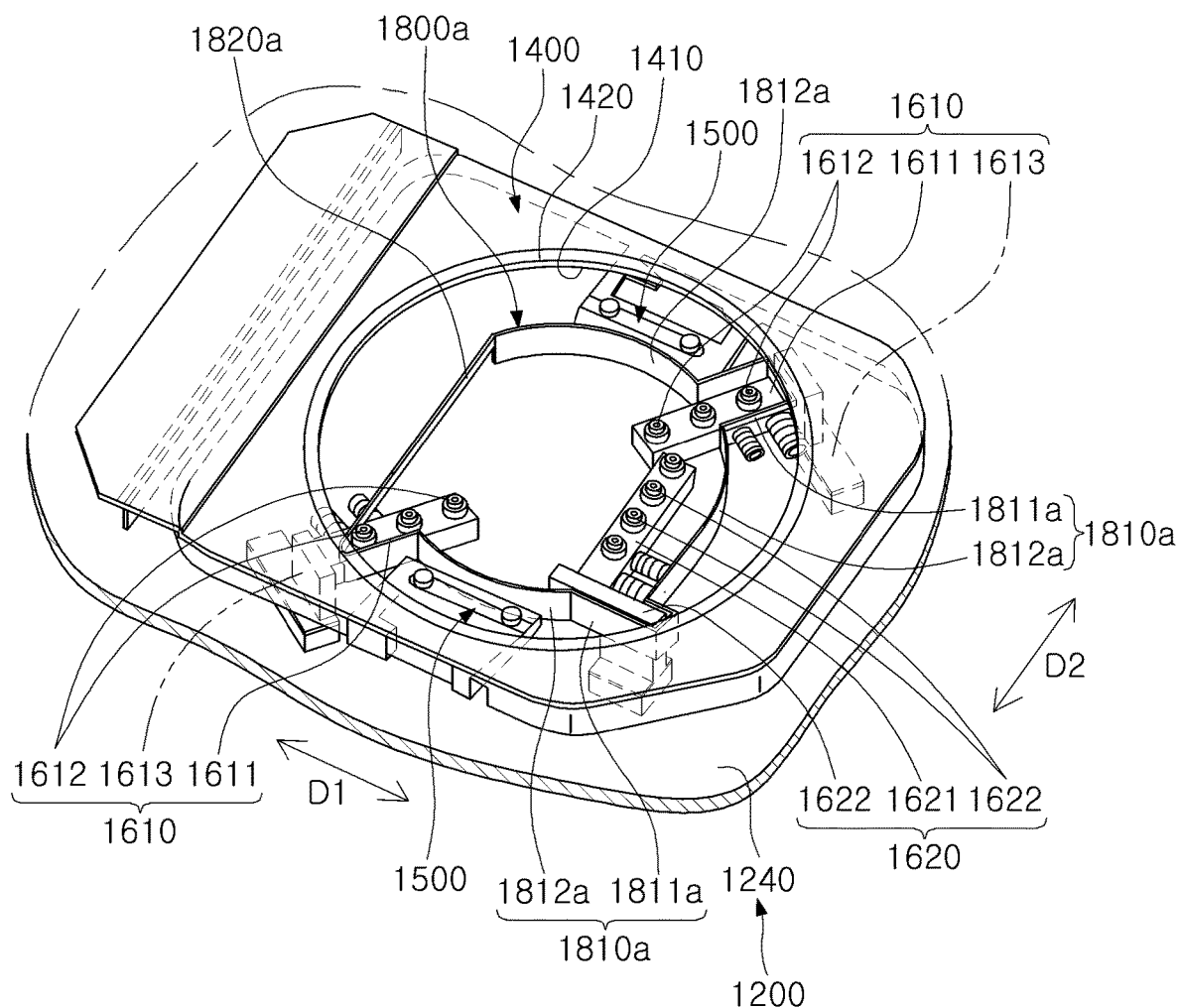
FIG. 9 is a diagram illustrating a portion of components of an apparatus for processing a substrate according to an embodiment of the present disclosure.
Figure 10:
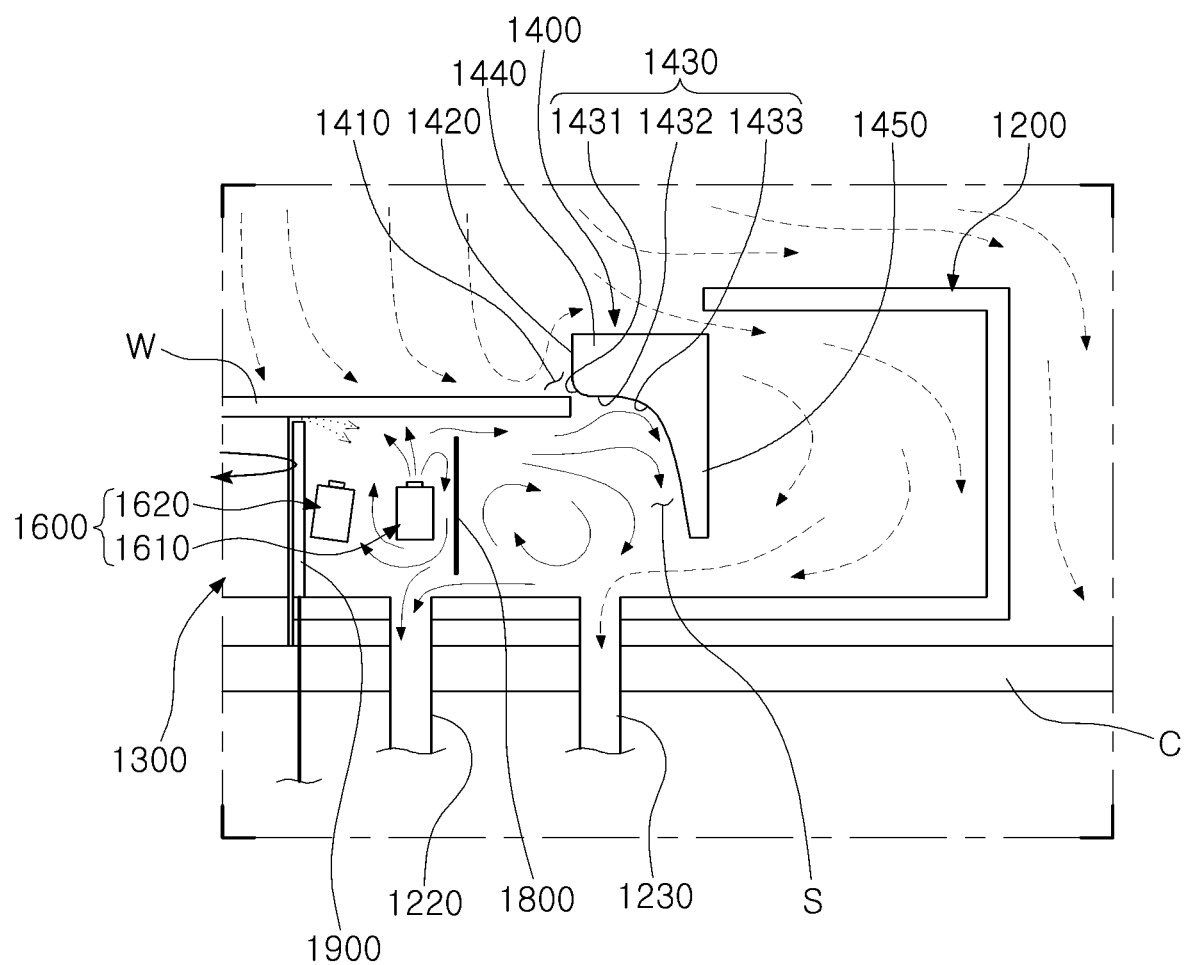
FIG. 10 is a diagram illustrating a flow of fluid in a state in which an edge region of a rear surface of a substrate is cleaned.
Figure 11:
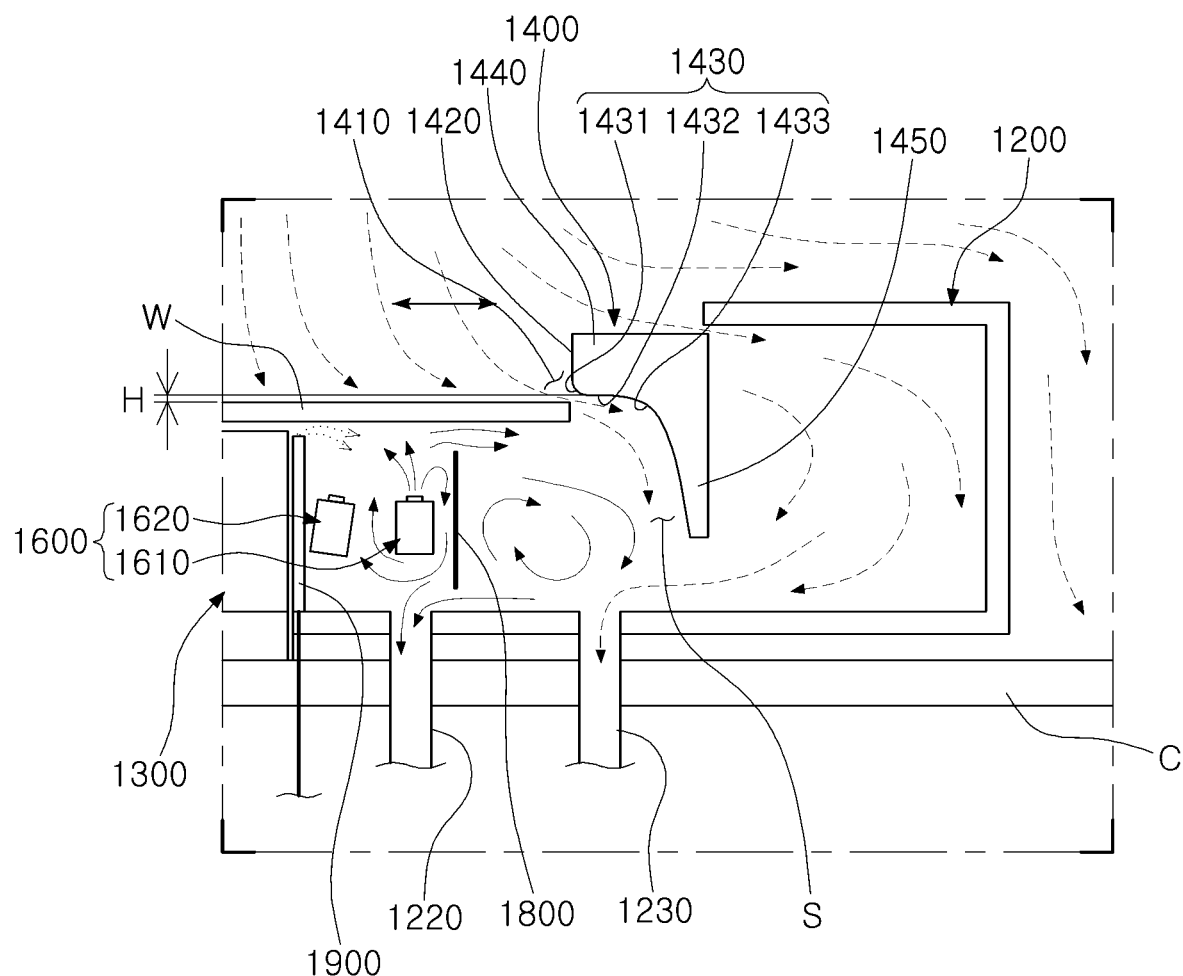
FIG. 11 is a diagram illustrating a flow of fluid in a state in which a central region of a rear surface of a substrate is cleaned.

FIG. 4 is a diagram illustrating a state in which a substrate is supported by a first support portion in an apparatus for processing a substrate for cleaning a rear surface of a substrate according to an embodiment. FIG. 5 is a diagram illustrating a state in which a substrate is supported by a second support portion in an apparatus for processing a substrate for cleaning a rear surface of a substrate according to an embodiment. FIG. 6 is a diagram illustrating a state of moving in a first direction in FIG. 5. FIG. 7 is a perspective diagram illustrating an apparatus for processing a substrate according to an embodiment. FIG. 8 is a diagram illustrating a portion of components of an apparatus for processing a substrate according to an embodiment. FIG. 9 is a diagram illustrating a portion of components of an apparatus for processing a substrate according to an embodiment. FIG. 10 is a diagram illustrating a flow of fluid in a state in which an edge region of a rear surface of a substrate is cleaned. FIG. 11 is a diagram illustrating a flow of fluid in a state in which a central region of a rear surface of a substrate is cleaned.

Referring to FIGS. 4 to 11, an apparatus 1000 for processing a substrate according to an embodiment may include a process chamber C, a gas flow generator 1100, a first bowl 1200, a first support portion 1300, a second bowl 1400, a second support portion 1500 and a cleaning unit 1600.

Here, the process chamber C may be a chamber disposed in the applying and developing module 400 applied to the photo processing process in the above description, but an embodiment thereof is not limited thereto, and the process chamber C may be applied to a process chamber in which the rear surface of the substrate needs to be cleaned, for example, an etching process, or a photo process cleaning process.

The gas flow generator 1100 may be configured to be disposed in the process chamber C and may supply gas into the process chamber C to generate a flow of gas.

The gas flow generator 1100 may include a fan filter unit 1110 and a chamber exhaust portion 1120. The fan filter unit 1110 of the gas flow generator 1100 may be connected to a gas supply source 1140 through a gas supply line 1130 and may supply purified gas into the process chamber C. Here, the gas may be clean air. The fan filter unit 1110 may be disposed on the upper wall of the process chamber C and may be configured to blow the purified gas into the process chamber C from the upper portion toward the lower portion through a filter (not illustrated) disposed in the gas supply line 1130. A chamber exhaust portion 1120 of the gas flow generator 1100 may be disposed in a lower portion of the process chamber C and may be connected to an exhaust means such as a vacuum pump to exhaust gas in the process chamber C. The gas flow generator 1100 may generate an airflow in which the gas flows down in the process chamber C by the fan filter unit 1110 and the chamber exhaust portion 1120. A portion of the gas flowing down by the gas flow generator 1100 may pass through the first bowl 1200 and the second bowl 1400 and may be exhausted.

The first bowl 1200 may be disposed in the process chamber C and may have a first opening 1210 having an upper portion and a processing space S therein. The first bowl 1200 may include a discharge portion 1220 for discharging liquid and an exhaust portion 1230 for discharging gas. Specifically, the discharge portion 1220 may be disposed in the lower portion of the first bowl 1200, may supply the cleaning liquid to the rear surface of the substrate W by the cleaning unit 1600, and may discharge the cleaning liquid externally through the discharge portion 1220 during cleaning. An exhaust portion 1230 may be disposed in the lower portion of the first bowl 1200, such that gas flowing into the first bowl 1200, for example, a portion of gases flowing into the process chamber C by the gas flow generator 1100 may flow into the first bowl 1200 and may be discharged externally through the exhaust portion 1230.

In the first bowl 1200, a first support portion 1300 supporting the substrate W may be disposed.

The first support portion 1300 may be disposed in the processing space S of the first bowl 1200 and may rotatably support the substrate W in the first support position P1. Here, the first support position P1 may refer to a position in which a rotation operation may be performed while the substrate W is supported by the first support portion 1300.

The first support portion 1300 may include a support chuck 1310 and a driving portion 1320. The support chuck 1310 may rotate the substrate W in the first support position P1 where the substrate W is supported by the support surface of the support chuck 1310. The driving portion 1320 may be implemented as a motor for driving the support chuck 1310 such that the support chuck 1310 may rotate around a rotation shaft. Accordingly, as illustrated in FIG. 4, the support chuck 1310 may rotate together with the substrate W around the rotation shaft by driving the driving portion 1320 in the first support position P1 in a state in which the substrate W is fixed to the support surface. In the first support position P1 in which the substrate W is supported by the first support portion 1300, the rear surface of the substrate W in a rotating state may be cleaned using the first cleaning portion 1610 of the cleaning unit 1600 to be described later. In particular, the edge region of the rear surface of the substrate W may be cleaned. The first support portion 1300 may be provided with a gas spraying portion 1900 for spraying gas between the support chuck 1310 and the rear surface of the substrate W to protect the support chuck 1310 from inflow of cleaning liquid into the support chuck 1310.

The first bowl 1200 may include a lower wall 1240 on which the first support portion 1300 is and a circumferential wall 1250 disposed along a circumferential direction from an edge of the lower wall 1240. The first bowl 1200 may include a base 1201 and an upper cover 1202 as a specific example. The base 1201 may have an open upper portion and may include the lower wall 1240 and the circumferential wall 1250. The discharge portion 1220 and the exhaust portion 1230 of the first bowl 1200 may be connected to the lower wall 1240. The upper cover 1202 may be disposed on an upper end of the circumferential wall 1250 of the base 1201 and may cover the upper portion of the base 1201 and may form a processing space S together with the base 1201. The first opening 1210 of the first bowl 1200 may be formed on the upper cover 1202.

The second bowl 1400 may be disposed in the processing space S of the first bowl 1200. The second bowl 1400 may have a second opening 1410 surrounding the substrate W, may be disposed to move in the first direction D1 in the processing space S of the first bowl 1200, and may be disposed to surround the first support portion 1300. The second bowl 1400 may be formed by a vertical wall surface 1420 in which an internal wall surface forming the second opening 1410 extends vertically. The second bowl 1400 may include an upper wall 1440 and a side wall 1450 extending downwardly around the upper wall 1440. A second opening 1410 surrounding the substrate W may be formed in the upper wall 1440. The upper wall 1440 may include a first surface connecting the second opening 1410 to the internal wall surface of the side wall 1450. In other words, the upper wall 1440 may include a vertical wall surface 1420 forming the second opening 1410 and a first surface 1430 connecting the vertical wall surface 1420 to the internal wall surface of the side wall 1450. Here, the connection portion of the first surface 1430 connected to the vertical wall surface 1420 of the upper wall 1440 and the connection portion of the second surface connected to the internal wall surface of the side wall 1450 may have a rounded shape to reduce flow resistance of the airflow and cleaning liquid. In other words, the first surface 1430 may include a first rounded surface 1431 connected to the vertical wall surface 1420 in a round manner, a horizontal surface 1432 connected to the first rounded surface 1431 and a second rounded surface 1433 connecting the horizontal surface 1432 to an internal wall surface of the side wall 1450. The side wall 1450 may extend downwardly from the first surface 1430 of the upper wall 1440.

Here, the first opening 1210 of the first bowl 1200 may be larger than the second opening 1410 of the second bowl 1400. That is, in the process of moving from the processing space S of the first bowl 1200 to the first direction D1 of the second bowl 1400, the size of the first opening 1210 of the first bowl 1200 may be larger than the size of the second opening 1410 of the second bowl 1400 such that the second opening 1410 of the second bowl 1400 may be entirely exposed to the first opening 1210 of the first bowl 1200. Specifically, the first opening 1210 of the first bowl 1200 may be configured to be larger than the second opening 1410 so as to entirely expose the second opening 1410 of the second bowl 1400 in which the substrate W of the first support position P1, a second support position P2 and a third support position P3 is exposed.

The second support portion 1500 may be configured as a component supporting the substrate W, and may support the substrate in a second support position P2 and a third support position P3, different from the first support position P1. The second support portion 1500 may move the substrate W upwardly and downwardly with respect to the first support portion 1300 between the second support position P2 and the third support position P3, and may also be configured to move in the first direction D1.

Here, the second support position P2 and the third support position P3 may refer to the starting position before moving in the first direction D1 with the substrate W supported by the second support portion 1500 and the moved position moving to the maximum distance in the first direction D1. Here, the second support position P2 may be a position in which the substrate moves to above the first support position P1, and the third support position P3 may be a position in which the substrate moves in the first direction D1 from the second support position P3. In other words, when the substrate W moves from the first support position P1 to the second support position P2, the second support portion 1500 may move up relative to the first support portion 1300 to separate the substrate W supported in the first support position P1 by the first support portion 1300 and may support the substrate W in second support position P2. In this state, the second support portion 1500 may move backward and forward the substrate W between the second support position P2 and the third support position P3 in the first direction D1 by moving together with the second bowl 1400. Conversely, when the substrate W moves from the second support position P2 to the first support position P1, the second support portion 1500 may move down relative to the first support portion 1300 to allow the substrate W to seat from the second support portion 1500 to the first support portion 1300, and the substrate W may be supported by the first support portion 1300 in the first support position P1.

Here, the shortest distance between the upper surface of the substrate W in the first support position P1 and the second bowl 1400 may be smaller than the shortest distance between the upper surface of substrate W of second support position P2 or third support position P3 and the second bowl 1400. In other words, the shortest distance between the upper surface of the substrate W in the first support position P1 and the first surface 1430 of the second bowl 1400 may be smaller than the shortest distance between the upper surface of the substrate W of the second support position P2 or the third support position P3 and the first surface 1430 of the second bowl 1400.

Here, the shortest distance between the upper surface of the substrate W and the second bowl 1400 of the first support position P1, the second support position P2 or the third support position P3 may be defined between the substrate W and the first rounded surface 1431. Specifically, the shortest distance between the upper surface of the substrate W of the first support position P1 and the first rounded surface 1431 of the second bowl 1400 may be smaller than the shortest distance between the upper surface of the substrate W of the second support position P2 or the third support position P3 and the first rounded surface 1431 of the second bowl 1400.

In the process of cleaning the rear surface of the substrate W through the first cleaning portion 1610 of the cleaning unit 1600 in a state in which the substrate W rotates in the first support position P1 by the first support portion 1300, to reduce the effect of gas flow inside process chamber C, the gas flowing into the gap between the substrate W and the second opening 1410 of the second bowl 1400 may be reduced such that vortex due to gas flowing into the second bowl 1400 may be prevented. Also, as redispersion of fine droplets onto the substrate W may be prevented. Alternatively, in a state in which the substrate W moves in the first direction D1 between the second support position P2 and the third support position P3 by the second support portion 1500, in the process of cleaning the rear surface of substrate W through the second cleaning portion 1620 of the cleaning unit 1600, the airflow in the first direction D1 may become stronger. To address the issue, the shortest distance between the upper surface of the substrate W and the first surface 1430 of the second bowl 1400 corresponding to the bottom of the second opening 1410 may be configured to be larger than that of the first support position P1, such that the amount of gas flowing into the gap between the substrate W and the second opening 1410 of the second bowl 1400 may be greater than that of the first support position P1, and the downdraft in the second bowl may be enhanced, and the airflow in the first direction D1 may be induced to flow into the second bowl 1400.

The second support portion 1500 may include a suction chuck coupled to the second bowl 1400. For example, the substrate W may move backward and forward between the second support position P2 and the third support position P3 in a vacuum adsorption state by an adsorption chuck for adsorbing the substrate W in a vacuum method. Also, the second support portion 1500 may include a plurality of, for example, two suction chucks disposed symmetrically about the center of the first opening 1210 of the first bowl 1200 to stably support the substrate W.

The second support portion 1500 may be implemented to operate integrally with the second bowl 1400.

Specifically, the second support portion 1500 may be coupled to the second bowl 1400 and may be disposed to move together with the second bowl 1400 and to move up and down. In this case, the apparatus 1000 for processing a substrate may include a second bowl driving portion 1700 for driving the second bowl 1400 to move and move up and down. The second bowl driving portion 1700 may be connected to the second bowl 1400 from the external side of the first bowl 1200, and may drive the second bowl 1400 to move the second bowl 1400 in the first direction D1 and to move up and down in the vertical direction in the processing space S of the first bowl 1200. In this case, the second support portion 1500 may move or move up and down together with the second bowl 1400. Specifically, the second support portion 1500 may be integrally coupled to the second bowl 1400 to move and move up and down together with the second bowl 1400, and may move upwardly and downwardly with respect to the first support portion 1300 integrally with the second bowl 1400 according to operation of the second bowl 1400 by driving the second bowl driving portion 1700, and may be configured to move the substrate W together with the second bowl 1400 in the first direction D1 between the second support position P2 and the third support position P3 above the first support position P1.

Here, the second bowl driving portion 1700 is not limited to any particular example, and may be implemented in various embodiments as long as the second bowl 1400 may move in the first direction D1 and be driven to move upwardly and downwardly. For example, the second bowl driving portion 1700 may be implemented as a drive method such as a gear driving method, a belt driving method, a cylinder driving method, or a driving method consisting of combinations thereof.

The cleaning unit 1600 may be a component for cleaning the rear surface of the substrate W, and may include a first cleaning portion 1610 and a second cleaning portion 1620.

As illustrated in FIG. 4, the first cleaning portion 1610 may be disposed below the substrate W toward the rear surface of the substrate 2 in the first support position P1. The first cleaning portion 1610 may clean an edge region of the rear surface of the substrate W supported by the first support portion 1300. Specifically, the first cleaning portion 1610 may clean the edge region of the rear surface of the substrate W while the substrate W rotates in the first support position P1 by the first support portion 1300. In this case, in the first support position P1, the upper surface of the substrate W may be disposed on the same plane as that of the horizontal surface 1432 of the first surface 1430 of the second bowl 1400. Accordingly, when the edge region of the rear surface of the substrate W is cleaned through the first cleaning portion 1610 in the state in which the substrate W rotates and is supported by the first support portion 1300 in the first support position P1, the gas flow generator 1100 in the process chamber C may provide a downward airflow. Since the downward airflow may be disposed on the same plane as that of the upper surface of the substrate W and the horizontal surface 1432 of the first surface 1430 of the second bowl 1400, the airflow may generally prevent inflow into the second bowl 1400 through a region between the substrate W and the second bowl 1400, and may flow in a circumferential direction of the external side of the second bowl 1400 such that vortex caused by gas flowing into the second bowl 1400 may be prevented, and cleaning efficiency for substrate W may be improved.

Also, a horizontal distance between the substrate W and the second opening 1410 of the second bowl 1400 may be 2 mm to 3 mm. By this configuration, a structure in which the upper surface of substrate W is disposed on the same plane as that of the horizontal surface 1432 of the first surface 1430 of the second bowl 1400 and also, the horizontal width between substrate W and the second bowl 1400 may be reduced and a permeation path of microdroplets between the substrate W and the second bowl 1400 may be reduced. Also, microdroplets which may hover around the first surface 1430 of the second bowl 1400 may be pushed by the round shape of the upper wall 1440 and side wall 1450 of the second bowl 1400 and the flow of gas flowing radially from the central region of the rear surface of the substrate W from the gas supply portion 1900 such that vortex may be effectively prevented, and scattering of cleaning liquid to the upper surface of substrate W may be effectively prevented.

The first cleaning portion 1610 may include a first cleaning nozzle 1611 disposed adjacent to the circumferential wall 1250 in the lower wall 1240 of the first bowl 1200. The first cleaning nozzle 1611 may be disposed on the lower wall 1240 of the first bowl 1200 by the first frame 1613. Also, one or more first cleaning nozzles 1611 may be provided if desired.

As illustrated in FIGS. 5 and 6, the second cleaning portion 1620 may be disposed below substrate W toward the rear surface of substrate 2 between a second support position P2 and a third support position P3. The second cleaning portion 1620 may clean the central region of the rear surface of the substrate W while the substrate W is supported by the second support portion 1500. Specifically, the second cleaning portion 1620 may clean the central region of the rear surface of the substrate W while the substrate W moves between the second support position P2 and the third support position P3 by the second support portion 1500. The second cleaning portion 1620 may include a second cleaning nozzle 1621 disposed adjacent to the first support portion 1300 on the lower wall 1240 of the first bowl 1200. That is, the second cleaning nozzle 1621 may be disposed adjacent to the first support portion 1300 relative to the first cleaning nozzle 1610 and may clean a central region of the rear surface of the substrate W.

Here, the second cleaning nozzle 1621 may be disposed on the lower wall 1240 of the first bowl 1200, but an embodiment thereof is not limited thereto, and may be coupled to a side wall of the first support portion 1300.

The second cleaning nozzle 1621 may be disposed on the lower wall 1240 of the first bowl 1200 by the second frame 1623. By this configuration, in the process of moving backward and forward between the second support position P2 and the third support position P3 while the substrate W is supported by the second support portion 1500, the central region of the rear surface of the substrate W may be cleaned through the second cleaning portion 1620.

In the process of moving backward and forward of the substrate W in the first direction D1, when the central region of the rear surface of the substrate W is cleaned, the airflow in the first direction D1 around the gap between the substrate W and the second bowl 1400 may become strong. Accordingly, more downdraft may be necessary to induce the airflow in the first direction D1 downwardly, such that the level difference H between the upper surface of the substrate W and the first surface 1430 of the second bowl 1400 may be realized.

That is, in the second support position P2 or the third support position P3, the support surface of the second support portion 1500 may have a predetermined level difference from the first surface 1430 of the second bowl 1400. Specifically, in the second support position P2 or the third support position P3, the support surface of the second support portion 1500 may have a predetermined level difference from the horizontal surface 1432 of the first surface 1430 of the second bowl 1400. Accordingly, in the second support position P2 or the third support position P3, the upper surface of the substrate W may be disposed on a level lower than a level of the horizontal surface 1432 of the first surface 1430 of the second bowl 1400. As a specific example, the support surface of the second support portion 1500 in the second support position P2 or the third support position P3 may have a level difference of 3 to 4 mm from the horizontal surface 1432 of the first surface 1430 of the second bowl 1400. Accordingly, the upper surface of the substrate W and the horizontal surface 1432 of the first surface 1430 of the second bowl 1400 may have a level difference H of 2 to 3 mm, for example. Accordingly, when the central region of the rear surface of the substrate W is cleaned through the second cleaning portion 1620 in the process of moving backward and forward between the second support position P2 and the third support position P3 while the substrate W is supported by the second support portion 1500, due to the level difference H between the upper surface of the substrate W and the horizontal surface 1432 of the second bowl 1400, a portion of the airflow in the first direction D1 may flow into the gap between the substrate W and the second bowl 1400 and a flow rate of the downdraft around the gap between the substrate W and the second bowl 1400 may be enhanced.

Also, as illustrated in FIGS. 7 to 9, the first cleaning portion 1610 may include two first cleaning nozzles 1611. The two first cleaning nozzles 1611 may be spaced apart with the second cleaning nozzle 1621 interposed therebetween. Also, the two first cleaning nozzles 1611 may be disposed symmetrically with respect to the center of the first support portion 1300. The first cleaning nozzle 1611 may include a plurality of first cleaning holes 1612 spaced apart from each other. Accordingly, uniform cleaning of the edge region of the rear surface of the substrate W may be realized through the first cleaning nozzle 1611 while the substrate W rotates and is supported by the first support portion 1300.

Also, the second cleaning nozzle 1621 may include a plurality of second cleaning holes 1622 disposed in the second direction D2 perpendicular to the first direction D1. Accordingly, uniform and precise cleaning of the central region of the rear surface of substrate W moving backward and forward in the first direction D1 may be implemented.

The first cleaning nozzle 1611 of the first cleaning portion 1610 and the second cleaning nozzle 1621 of the second cleaning portion 1620 may be disposed at different azimuth angles around the first support portion 1300.

Here, if necessary, at least one of the first cleaning nozzle 1611 and the second cleaning nozzle 1621 may be disposed to move. Accordingly, additional cleaning may be performed by moving the first cleaning nozzle 1611 or the second cleaning nozzle 1621 to a position corresponding to the area requiring further cleaning of the substrate W, and also by controlling the spraying region of the cleaning liquid on the substrate W rear surface, the cleaning efficiency may be further improved.

By the configuration of the apparatus 1000 for processing a substrate, when the rear surface cleaning of a general substrate, a reversing means to reverse the substrate may not be necessary, in a state in which the substrate W rotates and is supported by the first support portion 1300 or the second support portion 1500 or in a state in which the substrate W is supported for movement along the first direction D1, the edge region or central region of the rear surface of substrate W may be cleaned using the first cleaning portion 1610 or the second cleaning portion 1620, respectively, compactness of device may be implemented and cleaning efficiency may be improved.

Meanwhile, the apparatus 1000 for processing a substrate of an embodiment may include a guide portion 1800 for guiding a flow of fluid in the processing space S of the first bowl 1200. The guide portion 1800 may be disposed in the first bowl 1200, may surround the first cleaning portion 1610 and the second cleaning portion 1620, and may guide a flow of fluid in the processing space S of the first bowl 1200. Specifically, the guide portion 1800 may be disposed on the lower wall 1240 of the first bowl 1200 and may be disposed to surround the first cleaning nozzle 1611 of the first cleaning portion 1610 and the second cleaning nozzle 1621 of the second cleaning portion 1620.

The guide portion 1800 may be formed in various shapes.

For example, the guide portion 1800 may extend in a vertical direction between external sides of the first cleaning portion 1610 and the second cleaning portion 1620 and an inner side of the edge of the substrate W in the first support position P1. Specifically, the guide portion 1800 may extend in the vertical direction between the external side of the first cleaning nozzle 1611 of the first cleaning portion 1610, the external side of the second cleaning nozzle 1621 of the second cleaning portion 1620, and the inner side of the edge of the substrate W of the first support position P1. The guide portion 1800 may divide the space between the first support portion 1300 and the second bowl 1400 into a space between the first support portion 1300 and the guide portion 1800 and a space between the guide portion 1800 and the second bowl 1400 and may guide a flow of fluid in the space between the first support portion 1300 and the second bowl 1400 in a divided manner. An upper end surface of the guide portion 1800 may be disposed on a level lower than a level of a support surface of the first support portion 1300.

The guide portion 1800 may include a guide body 1810 and an avoidance portion 1820. The guide body 1810 may be disposed to surround at least a portion of the first cleaning portion 1610 and the second cleaning portion 1620, and specifically, and may surround the first cleaning nozzle 1611 of the first cleaning portion 1610 and the second cleaning nozzle 1621 of the second cleaning portion 1620. The guide body 1810 may be disposed between the external side of the first cleaning nozzle 1611 and the second cleaning nozzle 1621 and the inner side of the second opening 1410 of the second bowl 1400 when viewed from above. Specifically, the guide body 1810 may be disposed between the external side of the first cleaning nozzle 1611 and the second cleaning nozzle 1621 and the inner side of the edge of the substrate W when viewed from above.

By installing such a guide portion 1800, fine droplets scattering around the first cleaning nozzle 1611 and second cleaning nozzle 1621 may be prevented from flowing around the gap between the substrate W and the second bowl 1400, and may protect the gap between substrate W and second bowl 1400. Also, by dividing the space between the first support portion 1300 and the second bowl 1400 through the guide portion 1800, the vortex around the first cleaning nozzle 1611 and the second cleaning nozzle 1621 and the vortex at the bottom of the substrate W may be weakened, the cleaning liquid may be prevented from scattering, and the exhaust efficiency may increase.

Here, the guide body 1810 may include a plurality of first guide bodies 1811 surrounding the first cleaning nozzle 1611 and the second cleaning nozzle 1621 and a second guide body 1812 having an arc shape and connecting a plurality of first guide bodies 1811 to each other. The avoidance portion 1820 may be configured to avoid movement of the second bowl 1400 in the first direction D1. Specifically, as illustrated in FIGS. 7 and 8, the avoidance portion 1820 may include an avoidance port in which a portion of the guide body 1810 is open. Due to the configuration of the avoidance portion 1820 of the guide portion 1800, when the second bowl 1400 and the second support portion 1500 move backward and forward in the first direction D1, movement interference therebetween may be prevented.

As another example, the guide portion 1800a may include a guide body 1810a and an avoidance portion 1820a. The guide body 1810a may be disposed to surround at least a portion of the first cleaning portion 1610 and the second cleaning portion 1620, and specifically, may surround the first cleaning nozzle 1611 of the first cleaning portion 1610 and the second cleaning nozzle 1621 of the second cleaning portion 1620. The guide body 1810a may include a plurality of first guide bodies 1811a surrounding the first cleaning nozzle 1611 and the second cleaning nozzle 1621 and a second guide body 1812a having an arc shape and connecting a plurality of first guide bodies 1811a to each other. The avoidance portion 1820a may be configured to avoid movement of the second bowl 1400 in the first direction D1. Specifically, as illustrated in FIG. 9, the avoidance portion 1820a may include an avoidance wall in which a portion of the guide body 1810a extends in a linear line in a second direction D2 perpendicular to the first direction D1. Due to the structure of the avoidance portion 1820a of the guide portion 1800a, when the second bowl 1400 and the second support portion 1500 move backward and forward in the first direction D1, movement interference with the components may be prevented.

However, the configuration of the guide portion of an embodiment is not limited to the embodiment, and may be varied as long as a structure in which the guide portion may be disposed between the external side of the first cleaning nozzle and the second cleaning nozzle and the inner side of the edge of the plate and may address the vortex and scattering of the fluid in the first bowl and the second bowl may be implemented. For example, the guide portion may be disposed between the external side of the first cleaning nozzle and the second cleaning nozzle and the inner side of the edge of the plate, and may be implemented to have an overall arc shape disposed to surround the first cleaning nozzle and the second cleaning nozzle.

The cleaning process for the apparatus 1000 for processing a substrate of an embodiment will be described below.

A process of cleaning the edge region of the rear surface of the substrate W will be described with reference to FIG. 10. Gas may be supplied to process chamber C by the gas flow generator 1100, and downward airflow may flow. The substrate W may rotate together with the first support portion 1300 rotating around the rotation shaft by driving the driving portion 1320 in the first support position P1 fixed to and supported by the support surface of the first support portion 1300. In this state in which the substrate W rotates, the edge region of the rear surface of the substrate W may be cleaned using the first cleaning nozzle 1611 of the first cleaning portion 1610. During this cleaning process, gas may be sprayed to a region between the first support portion 1300 and the rear surface of the substrate W through the gas spraying portion 1900 and the first support portion 1300 may be protected such that the cleaning liquid may not flow into the first support portion 1300. Also, by the guide portion 1800 disposed around the first cleaning nozzle 1611 and the inner side of the edge of the substrate W, the space between the first support portion 1300 and the second bowl 1400 may be divided such that a portion of the fine droplets scattered around the cleaning nozzle 1611 may flow into the space between the first support portion 1300 and the guide portion 1800, and another a portion may flow into the space between the guide portion 1800 and the second bowl 1400, such that droplets may be discharged through the discharge portion 1220. Accordingly, the vortex around the first cleaning nozzle 1611 and the vortex under the substrate W may be weakened, the scattering of the cleaning liquid may be prevented, and the exhaust efficiency may be improved. Here, since the upper surface of substrate W and the horizontal surface 1432 of the first surface 1430 of the second bowl 1400 are disposed on the same plane, by suppressing the inflow into the second bowl 1400 through between the substrate W and the second bowl 1400, the downward airflow in the process chamber C may flow in the circumferential direction of the external side of the second bowl 1400, such that vortex due to gas flowing into the second bowl 1400 may be prevented.

In the description below, a process of cleaning the central region of the rear surface of substrate W will be described with reference to FIG. 11. Gas may be supplied to process chamber C by the gas flow generator 1100, and downward airflow may flow. In the process of moving backward and forward between the second support position P2 and the third support position P3 in the first direction D1 in a state in which the substrate W is supported by the second support portion 1500, the central region of the rear surface of the substrate W may be cleaned using the second cleaning nozzle 1621 of the second cleaning portion 1620.

Here, in the second support position P2 or the third support position P3, the upper surface of the substrate W may have a predetermined level difference H with a horizontal surface 1432 of the first surface 1430 of the second bowl 1400. Accordingly, in the process of moving backward and forward between the second support position P2 and the third support position P3 in a state in which the substrate W is supported by the second support portion 1500, When the central region of the rear surface of substrate W is cleaned through the second cleaning portion 1620, a portion of the airflow along the first direction in the process chamber C may flow in through the gap between the substrate W and the second bowl 1400 due to the level difference H, and a flow rate of the downdraft around the gap between the substrate W and the second bowl 1400 may be enhanced. Also, through the configuration of the guide portion 1800 disposed around the second cleaning nozzle 1621 and the inner side of the edge of the substrate W, the space between the first support portion 1300 and the second bowl 1400 may be divided, such that a portion of the fine droplets scattered around the second cleaning nozzle 1621 may flow into the space between the first support portion 1300 and the guide portion 1800, and another a portion may flow into the space between the guide portion 1800 and the second bowl 1400, such that droplets may be discharged through the discharge portion 1220. Accordingly, the vortex around the second cleaning nozzle 1621 and the vortex under the substrate W may be weakened, the scattering of the cleaning liquid may be prevented, and the exhaust efficiency may be improved.

In the above embodiment, the second support portion may be connected to the second bowl and may move up and down and move integrally, but an embodiment thereof is not limited thereto, and may be implemented by various embodiments. For example, the second support portion may be disposed to move up and down in the second bowl, and may be implemented to move in the first direction integrally with the second bowl.

In the embodiment, the apparatus for processing a substrate 1000 for cleaning the rear surface of the substrate W may be disposed in the position before moving to the exposure device of the photo process, but the embodiment is not an embodiment thereof limited thereto, and, for example, the apparatus may be disposed on the entrance side of the application and the development chamber, or may be disposed in the chamber in which the load port may be disposed. Also, the apparatus may be applied to other processes for cleaning the rear surface of the substrate other than the photo process.

According to the aforementioned embodiments, by the configuration of the apparatus for processing a substrate, a reversing means for reversing the substrate may not be necessary when the rear surface of the existing substrate is cleaned, and in a state in which the substrate rotates and is supported by the first support portion or the second support portion or in a state in which the substrate moves and is supported in the first direction, the edge region or the central region of the rear surface of the substrate may be cleaned using the first cleaning portion or the second cleaning portion, respectively, such that compactness of device may be implemented and cleaning efficiency may improve.

Also, by the configuration of the apparatus for processing a substrate, the shortest distance between the upper surface of the substrate in the first support position and the second bowl may be configured to be smaller than the shortest distance between the upper surface of the substrate in the second support position or the third support position and the second bowl, such that, in the process of cleaning the rear surface of the substrate in a state in which the substrate rotates in the first support position by the first support portion, gas entering the gap between the substrate and the second opening of the second bowl may be reduced, and vortex caused by gas flowing into the second bowl may be prevented, and redispersion of fine droplets to the substrate may be prevented. Also, in the process of cleaning the rear surface of the substrate in a state in which the substrate moves in the first direction between the second support position and the third support position by the second support portion, the amount of gas flowing into the gap between the substrate and the second opening of the second bowl may be greater than that of the first support position in the process chamber, such that the downdraft in the second bowl may be strengthened and the airflow in the first direction may be induced into the second bowl. Accordingly, the substrate may be stably cleaned, and the overall cleaning efficiency of the rear surface of the substrate may be improved.

While the embodiments have been illustrated and described above, it will be apparent to those skilled in the art that modifications and variations could be made without departing from the scope of the present disclosure as defined by the appended claims.

What is claimed is:

1. An apparatus for processing a substrate, the apparatus comprising:

a first bowl having a first opening having an upper portion and a processing space therein;
a first support portion disposed in the processing space and configured to support the substrate in a first support position to allow the substrate to rotate;
a second bowl having a second opening surrounding the substrate, disposed to move in a first direction in the processing space of the first bowl, and surrounding the first support portion;
a second support portion configured to move upwardly and downwardly with respect to the first support portion to support the substrate between the second support position disposed above the first support position and the third support position, which is a position spaced apart the first direction from the second support position, and to move in the first direction; and
a cleaning unit including a first cleaning portion disposed below the substrate toward a rear surface of the substrate in the first support position and a second cleaning portion disposed below the substrate and opposing a rear surface of the substrate between the second support position and the third support position,
wherein a shortest distance between an upper surface of the substrate in the first support position and the second bowl is smaller than a shortest distance between the second bowl and an upper surface of the substrate in the second support position or the third support position.

2. The apparatus of claim 1,
wherein the second bowl includes an upper wall in which the second opening is formed and a side wall extending downwardly from a circumferential surface of the upper wall, and the upper wall includes a first surface connecting the second opening to an internal wall surface of the side wall, and
wherein a support surface of the second support portion has a predetermined level difference from the first surface of the second bowl such that the upper surface of the substrate in the second support position or the third support position is disposed on a level lower than a level of the first surface of the second bowl.

3. The apparatus of claim 2, wherein the first surface includes a first rounded surface connected to the second opening in a rounded manner, and a shortest distance between the second bowl and the upper surface of the substrate in the first support position, the second support position or the third support position is defined between the substrate and the first rounded surface.

4. The apparatus of claim 3, wherein the first surface includes a horizontal surface connected to the first rounded surface, and an upper surface of the substrate in the first support position is disposed on the same plane as the horizontal surface.

5. The apparatus of claim 1, wherein the second bowl is formed by a vertical wall surface in which an internal wall surface forming the second opening extends vertically.

6. The apparatus of claim 2,
wherein a shortest distance between an upper surface of the substrate in the first support position and the second bowl is 3 to 4 mm, and
wherein the level difference is 3 to 4 mm.

7. The apparatus of claim 1,
wherein the first cleaning portion includes a first cleaning nozzle configured to clean an edge region of the substrate, and the second cleaning portion includes a second cleaning nozzle configured to clean a central region of the substrate, and wherein the first cleaning nozzle and the second cleaning nozzle are disposed at different azimuth angles around the first support portion.

8. The apparatus of claim 7, wherein the first cleaning portion includes a plurality of first cleaning nozzles disposed symmetrically with respect to a center of the first support portion.

9. The apparatus of claim 7, wherein the second cleaning nozzle includes a plurality of second cleaning holes disposed in a second direction perpendicular to the first direction.

10. The apparatus of claim 7, wherein at least one of the first cleaning nozzle and the second cleaning nozzle is disposed to moveable.

11. The apparatus of claim 7, further comprising:
a guide portion disposed in the first bowl, disposed to surround the first cleaning portion and the second cleaning portion, and configured to guide a flow of fluid in the processing space.

12. The apparatus of claim 1, wherein the guide portion extends in a vertical direction between an external side of the first cleaning portion and the second cleaning portion and an inner side of an edge of the substrate in the first support position.

13. The apparatus of claim 12, wherein the guide portion includes a guide body surrounding at least a portion of the first cleaning portion and the second cleaning portion and an avoidance portion configured to avoid movement of the second bowl in the first direction.

14. The apparatus of claim 13, wherein the avoidance portion includes an avoidance port in which a portion of the guide body is opened or an avoidance wall in which a portion of the guide body extends in a linear line in a second direction perpendicular to the first direction.

15. The apparatus of claim 1, wherein the second support portion includes an adsorption chuck coupled to the second bowl.

16. The apparatus of claim 1, further comprising:
a second bowl driving portion connected to the second bowl from an external side of the first bowl and configured to drive the second bowl to move in the first direction in the processing space and to move up and down in the vertical direction,
wherein the second support portion is coupled to the second bowl and is configured to move and move up and down integrally with the second bowl.

17. The apparatus of claim 1, wherein the first bowl includes a base having an upper portion and an upper cover having the first opening, covering an upper portion of the base, and forming the processing space together with the base, and the first opening is formed to be larger than the second opening to expose the second opening in the first support position, the second support position and the third support position.

18. An apparatus for processing a substrate, the apparatus comprising:
a first bowl having a first opening having an upper portion and a processing space therein;
a first support portion disposed in the processing space and configured to support the substrate in a first support position to allow the substrate to rotate;
a second bowl having a second opening surrounding the substrate, disposed to move in a first direction in the processing space of the first bowl, and surrounding the first support portion;
a second support portion coupled to the second bowl to move integrally with the second bowl and to move up and down integrally with the second bowl, and configured to move the substrate upwardly and downwardly with respect to the first support portion between the second support position above the first support position and the third support position, which is a position spaced apart the first direction from the second support position, and configured to move in the first direction;

a cleaning unit including a first cleaning portion including a first cleaning nozzle disposed below the substrate toward a rear surface of the substrate in the first support position, and a second cleaning portion disposed below the substrate and including a second cleaning nozzle disposed toward the rear surface of the substrate between the second support position and the third support position; and a guide portion disposed in the first bowl, and disposed to surround the first cleaning nozzle and the second cleaning nozzle and extending in a vertical direction between an external side of the first cleaning nozzle and the second cleaning nozzle and an inner side of an edge of the substrate in the first support position, wherein the second bowl includes an upper wall in which the second opening is formed and a side wall extending downwardly from a circumferential surface of the upper wall, and the upper wall includes a first surface connecting the second opening to an internal wall surface of the side wall, and wherein a shortest distance between the first surface and an upper surface of the substrate in the first support position is smaller than a shortest distance between the first surface and the upper surface of the substrate in the second support position or the third support position.

19. The apparatus of claim 1, wherein the support surface of the second support portion has a predetermined level difference from the first surface of the second bowl such that the upper surface of the substrate in the second support position or the third support position is disposed on a level lower than a level of the first surface of the second bowl, and the second bowl is formed by a vertical wall surface in which an internal wall surface forming the second opening extends vertically.

20. An apparatus for processing a substrate, the apparatus comprising:

a process chamber;

a gas flow generator disposed in the process chamber and configured to generate a flow of gas by supplying gas into the process chamber;

a first bowl disposed in the process chamber, having a first opening having an upper portion, a discharge portion having a processing space therein and configured to discharge liquid to a lower portion, and an exhaust portion configured to discharge gas;

a first support portion disposed in the processing space and supporting the substrate in a first support position to allow the substrate to rotate;

a second bowl having a second opening surrounding the substrate, formed by a vertical wall surface in which an internal wall surface forming the second opening extends vertically, move upwardly and downwardly in a processing space of the first bowl, and surrounding the first support portion disposed to move in a first direction;

a second bowl driving portion connected to the second bowl from the external side of the first bowl, and configured to drive the second bowl to move in the first direction and to move upwardly and downwardly in the processing space;

a second support portion coupled to the second bowl to move integrally with the second bowl and to move up and down integrally with the second bowl, configured to move the substrate upwardly and downwardly with respect to the first support portion between a second support position above the first support position and a third support position that, which is a position spaced apart the first direction from the second support position, and configured to move in the first direction;

a cleaning unit including a first cleaning portion including a plurality of first cleaning nozzles disposed below the substrate toward a rear surface of the substrate in the first support position, and a second cleaning portion including a second cleaning nozzle disposed below the substrate and disposed toward the rear surface of the substrate between the second support position and the third support position; and a guide portion disposed in the first bowl, disposed to surround the plurality of first cleaning nozzles and the second cleaning nozzle, and extending in a vertical direction between external sides of the plurality of first cleaning nozzles and the second cleaning nozzle and an inner side of an edge of the substrate in the first support position, wherein the second bowl includes an upper wall in which the second opening is formed and a side wall extending downwardly around the upper wall, the upper wall includes a vertical wall surface forming the second opening and a first surface connecting the vertical wall surface to an internal wall surface of the side wall, and the first surface includes a first rounded surface connected to the vertical wall surface in a rounded manner, a horizontal surface connected to the first rounded surface and a second rounded surface connecting the horizontal surface to the internal wall surface of the side wall, wherein a shortest distance between an upper surface of the substrate in the first support position and the first rounded surface is smaller than a shortest distance between an upper surface of the substrate in the second support position or the third support position and the first rounded surface, and wherein a support surface of the second support portion has a predetermined level difference from the horizontal surface such that an upper surface of the substrate in the second support position or the third support position is disposed on a level lower than a level of the horizontal surface.

* * * * *